United States Patent
Sikali Mamden

(10) Patent No.: US 12,026,439 B2
(45) Date of Patent: Jul. 2, 2024

(54) METHOD FOR SIMULATING THE OPTICAL POWER OF A LAMINATED GLASS

(71) Applicant: SAINT-GOBAIN GLASS FRANCE, Courbevoie (FR)

(72) Inventor: Yolande Sikali Mamden, Enghien les Bains (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 947 days.

(21) Appl. No.: 16/971,947

(22) PCT Filed: Feb. 18, 2019

(86) PCT No.: PCT/EP2019/053970
§ 371 (c)(1),
(2) Date: Aug. 21, 2020

(87) PCT Pub. No.: WO2019/162233
PCT Pub. Date: Aug. 29, 2019

(65) Prior Publication Data
US 2021/0089690 A1   Mar. 25, 2021

(30) Foreign Application Priority Data

Feb. 22, 2018   (FR) ...................................... 1851515

(51) Int. Cl.
  *G06F 30/20*  (2020.01)
  *B32B 17/10*  (2006.01)
  *G01N 21/88*  (2006.01)
  *G01N 21/958*  (2006.01)
  *G02B 27/00*  (2006.01)

(52) U.S. Cl.
  CPC ........ *G06F 30/20* (2020.01); *B32B 17/10036* (2013.01); *G01N 21/958* (2013.01);
  (Continued)

(58) Field of Classification Search
  CPC ............... G06F 30/20; B32B 17/10036; B32B 2307/40; B32B 2605/00; G01N 21/958;
  (Continued)

(56) References Cited

U.S. PATENT DOCUMENTS 3,639,112 A    2/1972  Poola
7,162,398 B2 *  1/2007  Yajima ..................... G06F 30/20
                                                    703/2

(Continued)

FOREIGN PATENT DOCUMENTS

CN    105138759 A    12/2015
EP    0 342 127 B1    11/1994
(Continued)

OTHER PUBLICATIONS

Youngquist, R. C., et al., "Optical Distortion Evaluation in Large Area Windows Using Interferometry," 14th International Symposium on Nondestructive Characterization of Materials (NDCM 2015)—www.ndt.net/app.NDCM2015, (2015, 10 pages.
(Continued)

*Primary Examiner* — Steven W Crabb
(74) *Attorney, Agent, or Firm* — Pillsbury Winthrop Shaw Pittman LLP

(57) ABSTRACT

A simulation method, implemented by computer, simulates the optical power of a laminated glass of given shape liable to be obtained by laminating at least two glass sheets and at least one lamination interlayer, the laminated glass being liable to have an edge, a first main face, and a second main face. The method is suitable for determining a minimum value of optical quality index which a combination of glass sheets must satisfy so as to form a laminated glass of given shape with a given optical quality constraint.

16 Claims, 10 Drawing Sheets

(52) U.S. Cl.
CPC ...... *G02B 27/0012* (2013.01); *B32B 2307/40* (2013.01); *B32B 2605/00* (2013.01); *G01N 2021/8883* (2013.01); *G01N 2021/9586* (2013.01)

(58) Field of Classification Search
CPC ... G01N 2021/8883; G01N 2021/9586; G02B 27/0012
See application file for complete search history.

(56) References Cited

U.S. PATENT DOCUMENTS

| | | | |
|---|---|---|---|
| 8,934,078 | B2 | 1/2015 | Gayout et al. |
| 2013/0295358 | A1 | 11/2013 | Paulus et al. |
| 2017/0291842 | A1* | 10/2017 | Paulus .............. B32B 17/10889 |

FOREIGN PATENT DOCUMENTS

| | | |
|---|---|---|
| EP | 0 463 940 B1 | 2/1995 |
| EP | 1 061 357 A2 | 12/2000 |
| GB | 2152210 A | 7/1985 |
| JP | 2008-070946 A | 3/2008 |
| WO | WO 98/17993 A2 | 4/1998 |
| WO | WO 2009/042903 A1 | 4/2009 |
| WO | WO 2012/028630 A1 | 3/2012 |

OTHER PUBLICATIONS

International Search Report as issued in International Patent Application No. PCT/EP2019/053970, dated May 2, 2019.

* cited by examiner

METHOD FOR SIMULATING THE OPTICAL POWER OF A LAMINATED GLASS

CROSS-REFERENCE TO RELATED APPLICATIONS

This application is the U.S. National Stage of PCT/EP2019/053970, filed Feb. 18, 2019, which in turn claims priority to French patent application number 1851515 filed Feb. 22, 2018. The content of these applications are incorporated herein by reference in their entireties.

The present invention relates to a method for simulating the optical power of a laminated glass. It is particularly suitable for determining a minimum value of optical quality index which a combination of glass sheets must satisfy so as to form a laminated glass of given shape with a given optical quality constraint. The subject of the invention is also a data processing system comprising means for implementing said method.

In general, the levels of optical quality demanded for laminated glasses used as glazing depend on the application. The angular deviations undergone by a light beam on passing through an optical defect present in a glazing do not have the same criticality depending on whether this glazing is intended to procure primarily visibility or brightness. For example, the windshield of an aerial or terrestrial vehicle requires a higher level of optical quality than that of a glazing intended to procure more light in a building. In the former case, no optical defect should have a size and/or a position liable to reduce the visual comfort of the driver or to encumber the driving of the vehicle since passenger safety is at stake. On the other hand, in the latter case, optical defects of larger sizes or situated in the middle of the glazing can be tolerated as long as they do not degrade the esthetics and the overall thermal performance of the glazing. Likewise, a glazing used in a digital display device such as a plasma screen or a liquid crystal screen must not exhibit any optical defect liable to disturb the display of the information and its perception by a user.

In this sense, numerous methods of checking the optical quality of glazings have been developed so as to be able to isolate and scuff those whose optical characteristics are unsuitable for the use for which they were intended. These methods are often implemented during or after manufacture. They are described in detail in the prior art.

For example, patents EP 0463940 B1 and EP0342127 B1 describe automatable procedures for checking a glazing in which the levels of optical deformation of the glazing are determined on the basis of an ombroscopic image and then compared with previously defined threshold values. Patent applications WO9817993 and GB2152210 as well as patent EP 1061357 disclose procedures for detecting the optical anomalies of a transparent sheet by analyzing the image of a geometric pattern reflected or transmitted by the sheet.

However, these checking methods, whether they are implemented during or after production, as fast as they may be, cannot avoid production losses.

Certain patent applications propose methods of numerical simulation to anticipate possible optical anomalies related to the shaping of the glazing. For example, the simulation methods based on ray tracing described in patent applications CN 105138759 and JP2008070946 can be adapted to evaluate the effect, on the transmitted light, of the refractive index gradients of a glazing after shaping. Patent application WO 2021028630 discloses a procedure for simulating the forming of a glazing utilizing a database comprising information on the alterations of shape of a glass sheet according to the spatio-temporal distributions of temperature that it may undergo in the course of forming. Each shape can thereafter form the subject of an evaluation of its optical quality.

However, these methods do not make it possible to anticipate the technical difficulties inherent in the manufacture of certain shapes of laminated glass of given optical quality. Thus today a heuristic approach is often used to determine the required minimum optical quality for the glass sheets used during forming. Indeed, apart from vagaries or imperfections related to the manufacturing procedure, the optical quality of a laminated glass is conditioned at one and the same time by its shape and the optical quality of the glass sheets used to manufacture it. It may happen that the glass sheets of a certain optical quality that are used to produce a glazing of a given shape and of given optical quality cannot be used directly to produce a glazing of another shape and another optical quality. The heuristic approach then consists generally, for a glazing shape of given optical quality, in experimenting with this shape on different optical quality glass sheets until the sought-after result is obtained. The loss in time and material is generally not negligible.

Moreover, it would be technically and economically quite irrelevant to manufacture a glazing of given shape and given optical quality with the aid of glass sheets whose optical quality were higher than the use for which the glazing is intended. The solution which would consist in systematically using glass sheets of higher optical quality to produce any type of laminated glass, including those for which certain types of optical defects are tolerable, would amount to adding needless technical constraints on the manufacturing procedures. On the other hand, it would be technically more advantageous to be able to determine a priori, before any manufacture, the minimum optical quality level that the glass sheets must possess for the manufacture of a laminated glass of given shape and optical quality. Not only would the gain in time and material be more significant, but also the technical difficulties related to the shaping of the glazing could be anticipated. However, current methods of checking or simulation do not make it possible to obtain such information.

The present invention solves these problems. It relates to a simulation method, implemented by computer, for simulating the optical power of a laminated glass of given shape liable to be obtained by laminating at least two glass sheets and at least one lamination interlayer, said laminated glass being liable to have an edge, a first main face, and a second main face, and said method comprising the following steps:

a1. The geometric modeling of a first surface liable to correspond to the first main face of the laminated glass on the basis of a numerical model of the shape of said laminated glass so as to form a first modeled surface;

b1. The geometric modeling of a second surface obtained by translation of the surface modeled in step (a1) along the direction of smallest dimension of the laminated glass by a distance $\varepsilon$ corresponding to the thickness of the laminated glass, and along the direction of one of the two larger dimensions of the laminated glass by a defined distance $\delta$, the ratio of the distance $\delta$ over the largest dimension of the laminated glass being greater than 0 and less than or equal to 0.01, and said modeling making it possible to obtain a second modeled surface;

c1. The calculation of the geometric offset $\tau$, at each of the points of the modeled surfaces, by subtraction of the first modeled surface and of the second modeled surface;

d1. The calculation of the geometric thickness ε', at each of the points of the modeled surfaces, by addition of the distance ε and of the geometric offset τ;

e1. The calculation of the topological thickness π, at each of the points of the modeled surfaces, by subtraction of the topographic profiles of the surfaces of the glass sheets liable to correspond to the first main face and second main face of the laminated glass;

f1. The calculation of the optical power PO, at each of the points of the modeled surfaces, on the basis of the value of the Laplacian of the sum of the geometric thickness ε' and topological thickness π.

A first advantage of the method of the invention is that it makes it possible to check, before manufacture, any combination of the effects of shape of the laminated glass and of the optical quality of the surfaces of the glass sheets used as first and second main faces. Potentially defective combinations can be anticipated and production losses thus be advantageously reduced.

A second advantage of the method is its swiftness of execution. It is, in terms of execution speed, about 50 times faster to implement than current simulation methods based on ray tracing. For example, with comparable data processing capabilities, a simulation method based on ray tracing requires 30 minutes to obtain the optical power of a laminated glass. The simulation method of the invention makes it possible to obtain the optical power of 50 laminated glasses in the same time. This advantage enables the real-time use of the method on laminated-glass production lines where changes in production planning are liable to take place. In particular, if a particular shape of laminated glass must be produced in an emergency, the method of the invention makes it possible to check the optical power liable to be obtained in a few tens of seconds.

The geometric modeling of steps (b1) and (c1) can be carried out by any suitable means. This geometric modeling can advantageously be carried out with the aid of computer-aided design (CAD) tools, this being a very widespread technique in the industry. These tools make it possible to create numerical models of mechanical parts, and are particularly suitable for modeling the shape of a laminated glass.

In step (c1) of the simulation method of the invention, the second modeled surface is obtained by translation of the first modeled surface. The first and second modeled surfaces are generally mutually parallel. The ratio of the distance δ over the largest dimension of the glazing is greater than 0 and less than or equal to 0.01. The ratio lies, preferably, between 0.001 and 0.01.

In step (e1) of the simulation method of the invention, the topographic profiles of the surfaces of glass sheets liable to correspond to the first main face and to the second main face of the laminated glass are used for the calculation of the topological thickness π. It has been found experimentally that the contribution of the topographic profiles of the surfaces of the glass sheets in contact with the lamination interlayer, and the contribution of the interlayer itself were generally negligible. Indeed, the comparison of the optical power values obtained with the aid of the simulation method of the invention with those obtained with the aid of a method taking account of the topographic profiles of the surfaces of the glass sheets in contact with the interlayer were relatively close. In a laminated glass the refractive index of the lamination interlayer is identical, or else close, to that of the glass sheets. In certain embodiments of the invention, it is nonetheless possible to take account of the contribution of the topographic profiles of the surfaces of the glass sheets in contact with the lamination interlayer, and of the contribution of the interlayer in the calculation of the topological thickness π.

Because of their shape, in particular because of their general curvature, the laminated glasses used as glazing can be affected by optical distortions having consequences on the optical power. In this sense, in a particular embodiment of the procedure of the invention, the geometric thickness ε' and topological thickness π are each weighted by an optical amplification factor dependent on the angle, θ, formed between the direction normal to the first surface and a reference direction of observation of the laminated glass. By way of example, this reference direction of observation can be the direction of observation of a driver and/or of the passengers in a terrestrial or aerial vehicle in which the laminated glass is used as windshield.

The optical power at each of the points can for example be calculated with the aid of the following expression:

$$PO = -(n-1) * \Delta[A_\pi(\theta)\pi + A_{\varepsilon'}(\theta)\varepsilon']$$

where n is the refractive index of the glass and $A_\pi$ and $A_{\varepsilon'}(\theta)$ are amplification factors calculated with the aid of following formulae:

$$A_\pi(\theta) = \frac{\left(\sqrt{n^2 - \sin^2\theta} - \cos\theta\right)}{n-1}$$

$$A_{\varepsilon'}(\theta) = \frac{\left(\sqrt{n^2 - \sin^2\theta} - \cos\theta\right)}{(n-1)\cos^2\theta}$$

The topographic profiles of the surfaces of glass sheets liable to correspond to the first main face and to the second main face of the laminated glass can generally be obtained in two different ways.

According to a first way, the profiles are profiles measured by profilometric methods with or without contact. A contact profilometric method consists, for example, in scanning the surface with the aid of a stylus in physical contact with said surface and by measuring the vertical displacements thereof. In the sector of the glass industry, contactless profilometric methods are generally more usual. This often entails matrix-based or scan-based optical profilometric methods such as ombroscopy, optical interferometry, or else digital holography. In particular, ombroscopic methods are much used. They are described with in detail in the prior art, for example in patent applications EP 0463940 or EP 0342127. Within the framework of the manufacture of a laminated glass, the topographic profiles are generally provided by the manufacturer of the glass sheets.

According to a second way, the topographic profiles are numerically simulated profiles. It may be advantageous to generate the topographic profiles with the aid of mathematical functions so as to check, in advance, the effect of one or more topographic profiles on the optical power values of a laminated glass with a shape given with the aid of the method of the invention. Such an approach makes it possible, for example, to establish technical specifications without having to resort to experimental data on the topographic profiles. These technical specifications can thereafter be transmitted to a supplier of glass sheets before any provisioning so that they can verify that the glass sheets that they are able to provide meet the needs. The generation of the topographic profiles by mathematical functions can also be carried out on the basis of a library of experimental topographic profiles used as models.

In certain applications, rather than obtaining values of optical power at any point of the laminated glass, it may be more practical to use a synthetic parameter representative of the overall optical power of the laminated glass. In this sense, in an embodiment of the invention, the simulation method furthermore comprises, after step (f1), a step of determining an optical fluctuation index φ on the basis of the values of the optical powers PO obtained at each of the points of the modeled surfaces. This optical fluctuation index can have the dimension of an optical power. In particular, this optical fluctuation index φ can be the standard deviation of the values of the optical powers PO or the maximum value of the optical powers PO.

When the laminated glass is used as windshield in the terrestrial or aerial vehicles sector, in particular in the automotive sector, it is common to use a rate of variation of the optical power (or "rate of change"). In a particular embodiment of the procedure of the invention, the optical fluctuation index φ can correspond to this rate of variation. It can then be defined as being the maximum value of a set of values corresponding to the differences between the maximum and minimum values of the optical powers PO in a sliding sampling window. In most applications, the sampling window can advantageously be a square or rectangular sampling window whose lateral dimensions lie between 2 mm and 100 mm, preferably between 5 and 50 mm.

In the particular case of windshields, only the region or regions of the laminated glass corresponding to the zone or zones of vision of the driver and/or of the passengers must generally have an optical quality such that visibility is not impaired when driving the vehicle. Thus, in an embodiment of the simulation method of the invention, the determination of the optical fluctuation index φ is carried out in a limited region of the main faces of the laminated glass. This limited region can be defined in compliance with directive 92/22/EEC of the European Union or in compliance with regulation 43 of the United Nations economic commission for Europe, in particular in point 9.2.5.2.3 of said regulation. Within the meaning of the invention, this limited region can correspond to the region delimited by the intersection of the main faces of said laminated glass with a square-based pyramid whose apex is situated at a defined distance from the main faces and the two angles at the vertex between the opposing lateral faces of said pyramid lie respectively between 10° and 20°, and between 5 and 15°.

The simulation method of the invention described hereinabove is particularly suitable for determining a minimum value of optical quality index which a combination of glass sheets must satisfy so as to form a laminated glass with a given optical quality constraint. The simulation method can then be integrated as intermediate steps in a method allowing this determination. Thus, the subject of the invention is also a determination method, implemented by computer, for determining an interval of optical quality indices required for a combination of glass sheets liable to form a laminated glass of given shape liable to be obtained by laminating at least two glass sheets and at least one lamination interlayer, said laminated glass having a given optical quality constraint, Θ, and said method comprising the following steps:

a2. The selection of a combination of glass sheets from among a set of glass sheets with which are associated at least one identifier, a topographic profile and an optical quality index;

b2. The calculation of the optical quality index of the combination of glass sheets on the basis of the optical quality indices of the two glass sheets of the combination, one of the surfaces of each of said two glass sheets is liable to correspond respectively to the first main face or to the second main face of the laminated glass;

c2. The determination of an optical fluctuation index φ of a laminated glass liable to comprise the combination of the glass sheets with the aid of a simulation method according to any one of the embodiments described hereinabove;

d2. The repetition of steps (a2) to (c2) with a new combination of glass sheets so as to obtain a set of values of optical fluctuation indices φ for the various possible combinations;

e2. The comparison of the values of the optical fluctuation indices, φ, with the value of the optical quality constraint Θ;

f2. The selection of the interval of the optical quality indices of the combinations of the glass sheets satisfying the result of the comparison of step (e2).

This method makes it possible to determine, a priori, before any production, the minimum optical quality level that a combination of glass sheets must possess in order to manufacture a laminated glass of given shape and given optical quality. The advantage is a non-negligible gain in time and material with respect to an experimental heuristic approach and more effective anticipation of the difficulties related to the shaping of the laminated glass.

The optical quality constraint Θ can have the dimension of an optical power.

In order to optimize the time necessary for the execution of the steps of said method, it is not necessary to carry out steps (a1) to (d1) of the method of simulation of step (c2) for each combination of glass sheets that is selected in step (a2). For each shape of laminated glass for which the interval of optical quality index of the combinations of glass sheets making it possible to satisfy the optical power constraint Θ is sought, steps (a1) to (d1) of the method of simulation of step (c2) can be executed just once. The result can thereafter be preserved for the execution of the other steps with each combination of glass sheet.

The identifier, the topographic profile and the optical quality index which are associated with each of the glass sheets can be selected on the basis of a numerical database comprising entities representing the glass sheets. Each entity representing the glass sheets then possesses, among its attributes, an identifier, a topographic profile and an optical quality index.

This database can be supplied with the data transmitted by the manufacturers or suppliers of glass sheets. It can also comprise entities representing glass sheets whose topographic profiles have been obtained by numerical simulation.

In practice, the optical quality index of the combinations of glass sheets is a synthetic parameter making it possible to inter-compare the combinations. This index can in particular be a numerical value making it possible to sort them. In a particular embodiment of the method for determining an interval of optical quality indices, the optical quality index of the combinations of the glass sheets is the root mean square of the mean optical quality indices of the two glass sheets of the combination, one of the surfaces of each of said glass sheets being liable to correspond respectively to the first main face and to the second main face of the laminated glass, said mean optical quality indices being obtained by ombroscopic methods.

For example, an optical quality index, denoted $\overline{NO}$, can be calculated with the aid of the following formula:

$$\overline{NO} = \sqrt{\frac{(NO_{FV1})^2 + (NO_{FV2})^2}{2}}$$

where $NO_{FV1}$ and $NO_{FV2}$ are respectively the mean optical quality indices of the first glass sheet and the second glass sheet, obtained with the aid of an ombroscopic method. Examples of ombroscopic methods are described in detail in the prior art, for example in patent applications EP 0463940 or EP 0342127. The measurement unit of the quantities $\overline{NO}$, $NO_{FV1}$ and $NO_{FV2}$ are generally the diopter.

The method for simulating the optical power and the method for determining the optical quality of the combination of glass sheets are implemented by computer. The subject of the invention is also a computer program comprising instructions executable by a computer allowing the execution of the steps of these two methods of the invention in all their possible embodiments. Any type of programming language compiled to a binary or directly interpreted form can be used to implement the steps of the methods through a string of arithmetical or logical instructions executable by a computer or any programmable information processing system. The computer program can form part of an item of software, that is to say of a set of executable instructions and/or of one or more collections of data or of databases.

The computer program can be stored on a storage medium decipherable by computer. This storage medium is preferably a nonvolatile or remanent computer memory, for example a magnetic mass memory or semi-conductor memory (solid state drive, flash memory). It can be removable or integrated into the computer which deciphers the content thereof and executes the instructions thereof.

The storage medium can be integrated into a remote computer, called a "server", different from that which executes the instructions, called the "client". To execute the instructions contained in the storage medium, the "client" computer accesses with the aid of an appropriate physical and/or aerial telecommunication means the memory space of the "server" computer in which the computer program is recorded. The "server" computer can also decipher the storage medium on which the computer program is stored and communicate the instructions in binary form to the "client" computer by any telecommunication means.

It may be advantageous for the storage medium to be a removable medium or to be remotely accessible by a telecommunication means so as to facilitate the dissemination of the invention in the places where it is liable to be used.

The method for determining an interval of optical quality indices required for a combination of glass sheets liable to form a laminated glass with a given optical quality constraint, $\Theta$, can be integrated into a procedure for manufacturing a laminated glass with an optical quality constraint. The present invention also relates to a procedure for manufacturing a laminated glass comprising at least two glass sheets and at least interlayer, said laminated glass of given shape having an edge, a first main face and a second main face, said laminated glass having a given optical quality constraint, $\Theta$, said procedure comprises the following steps:

a. the selection, implemented by computer, of a combination of glass sheets from among a set of glass sheets with which are associated at least one identifier, a topographic profile and an optical quality index, said combination of glass sheets being liable to form said laminated glass;

b. the calculation, implemented by computer, of the optical quality index of the combination of glass sheets on the basis of the optical quality indices of the two glass sheets of the combination, one of the surfaces of each of said two glass sheets is liable to correspond respectively to the first main face or to the second main face of the laminated glass;

c. the geometric modeling, implemented by computer, of a first surface corresponding to the first main face of the laminated glass on the basis of a numerical model of said laminated glass so as to form a first modeled surface;

d. the geometric modeling, implemented by computer, of a second surface obtained by translation of the surface modeled in step a along the direction of smallest dimension of the laminated glass by a distance $\varepsilon$ corresponding to the thickness of the laminated glass, and along the direction of one of the two larger dimensions of the laminated glass by a defined distance $\delta$, the ratio of the distance $\delta$ over the largest dimension of the laminated glass being greater than 0 and less than or equal to 0.01, and said modeling making it possible to obtain a second modeled surface;

e. the calculation, implemented by computer, of the geometric offset $\tau$ obtained by subtraction of the first modeled surface and of the second modeled surface at each of the points of the surfaces;

f. the calculation, implemented by computer, of the geometric thickness $\varepsilon'$ by addition of the distance $\varepsilon$ and of the geometric offset $\tau$ at each of the points of the surfaces;

g. the calculation, implemented by computer, of the topological thickness $\varepsilon'$ obtained by subtraction of the topographic profiles of the surfaces of the glass sheets liable to correspond to the first main face and second main face of the laminated glass at each of the points of the faces;

h. the calculation, implemented by computer, of the optical power PO on the basis of the value of the Laplacian of the sum of the geometric thickness $\varepsilon'$ and topological thickness $\pi$ at each of the points of the modeled surfaces;

i. the calculation, implemented by computer, of an optical fluctuation index $\varphi$ corresponding to the maximum value of a set of values corresponding to the maximum values of the differences between the maximum and minimum values of the optical powers PO in a sliding sampling window;

j. the repetition of steps (a) to (i) with a new combination of glass sheets so as to obtain a set of values of optical fluctuation indices $\varphi$ for each possible combination;

k. the comparison, implemented by computer, of the values of the optical fluctuation indices, $\varphi$, with the value of the optical quality constraint $\Theta$;

l. the selection, implemented by computer, of the interval of the optical quality indices of the combinations of the glass sheets satisfying the result of the comparison of step (j);

m. the manufacture of a laminated glass comprising a combination of the glass sheets whose optical quality index lies in the interval determined in step (k).

The method for simulating the optical power and the method for determining the optical quality of a combination of glass sheets can be implemented with the aid of a data processing system comprising means allowing this implementation.

This data processing system can comprise a computer integrating one or more central processing units suitable for implementing the simulation method of the invention. The computer can comprise other electronic components necessary for its operation, such as input-output interfaces, volatile and/or remanent storage systems and BUSes, necessary for transferring the data between the central processing units and for communicating with exterior systems. One of the input-output interfaces can be advantageously a user interface allowing human-machine interactions. In particular, to facilitate the representation and the communication of the data obtained with the aid of the system of the invention, this user interface can be graphical.

By way of example, a data processing system making it possible to simulate the optical power of a laminated glass of given shape liable to be obtained by laminating at least two glass sheets and at least one lamination interlayer, said laminated glass being liable to have an edge, a first main face, and a second main face, can comprise the following means:

a. a means for geometric modeling of a first surface corresponding to the first main face of the laminated glass on the basis of a numerical model of the shape of said laminated glass so as to form a first modeled surface;

b. a means for geometric modeling of a second surface obtained by translation of the surface modeled in step a along the direction of smallest dimension of the laminated glass by a distance ε corresponding to the thickness of the glazing, and along the direction of one of the two larger dimensions of the laminated glass by a defined distance δ, the ratio of the distance δ over the largest dimension of the laminated glass being greater than 0 and less than or equal to 0.01, and said modeling making it possible to obtain a second modeled surface;

c. a means for calculating the geometric offset τ, at each of the points of the modeled surfaces, by subtraction of the first modeled surface and of the second modeled surface;

d. a means for calculating the geometric thickness ε', at each of the points of the modeled surfaces, by addition of the distance ε and of the geometric offset τ;

e. a means for calculating the topological thickness π, at each of the points of the modeled surfaces, by subtraction of the topographic profiles of the surfaces of the glass sheets liable to correspond to the first main face and second main face of the laminated glass;

f. a means for calculating the optical power PO, at each of the points of the modeled surfaces, on the basis of the value of the Laplacian of the sum of the geometric thickness ε' and topological thickness π.

In a particular embodiment, the data processing system can furthermore comprise a means for determining the optical fluctuation indices φ.

By way of example, a system for determining an interval of optical quality indices required for a combination of glass sheets liable to form a laminated glass of given shape liable to be obtained by laminating at least two glass sheets and at least one lamination interlayer, said laminated glass having a given optical quality constraint, Θ, can comprise the following means:

a. a means for selecting a combination of glass sheets from among a set of glass sheets with which are associated at least one identifier, a topographic profile and an optical quality index;

b. a means for calculating the optical quality index of the combination of glass sheets on the basis of the optical quality indices of the two glass sheets of the combination, one of the surfaces of said two glass sheets is liable to correspond respectively to the first main face or to the second main face of the laminated glass;

c. a data processing system making it possible to determine an optical fluctuation index φ of a laminated glass liable to comprise the combination of the glass sheets, d. a means for comparing the values of the optical fluctuation indices φ with the value of the optical quality constraint Θ;

e. a means for selecting the interval of the optical quality indices of the combinations of the glass sheets satisfying the result of the comparison.

In one embodiment, said system can furthermore comprise a means for direct or indirect telecommunication with a storage medium decipherable by computer comprising a database containing for each glass sheet of the set of glass sheets, an identifier, a topographic profile and an optical quality index.

In the two examples of processing system, the calculation means, geometric modeling means, comparison means and selection means, can be one or more calculation units. They can also be virtual means instantiated in the form of objects on the basis of classes in a computer's random-access memory, possibly assisted by a virtual memory, by a computer program or item of computer software.

A computer program of the invention and/or a data processing system making it possible to implement the steps of the simulation method and/or of the method for determining an interval of optical quality indices can be integrated into a computing infrastructure of "cloud computing" type. A "client" computer can serve as cloud-computing access platform. The advantage of such an embodiment is, for example, to allow several parties implementing the method or methods of the invention to pool technical means and to centralize the information. For example, several sites for manufacturing laminated glasses with different shapes and optical quality constraints can transmit the relevant information as regards these shapes and optical quality constraints across said infrastructure. Once the information has been processed by said program or said system or systems, the results relating to the optical power or to the optical quality interval can be transmitted to the manufacturing sites across the same infrastructure.

A system for determining an interval of optical quality indices required for each of the glass sheets of a combination of glass sheets liable to form a laminated glass comprising at least two glass sheets and at least one interlayer, said laminated glass having a given optical quality constraint, Θ, can furthermore comprise a database containing for each glass sheet of a laminated glass set, an identifier, a topographic profile and an optical quality index. This database can also be included in a computing infrastructure of "cloud computing" type.

This embodiment is particularly advantageous in the case where a supplier or a manufacturer of glass sheets makes available in a computing infrastructure a database in which is contained technical information on the glass sheets that they are able to provide. If the information comprises, for each glass sheet, an optical quality index and a topographic profile, a party or a client, who implements the invention, can access this database and verify before any provisioning request whether said supplier or said manufacturer has the immediate capability to provide glass sheets having sufficient optical quality for the manufacture of a laminated glass of given shape and a given optical quality constraint.

The characteristics and the advantages of the invention are illustrated by the figures hereinbelow.

Figure 13:
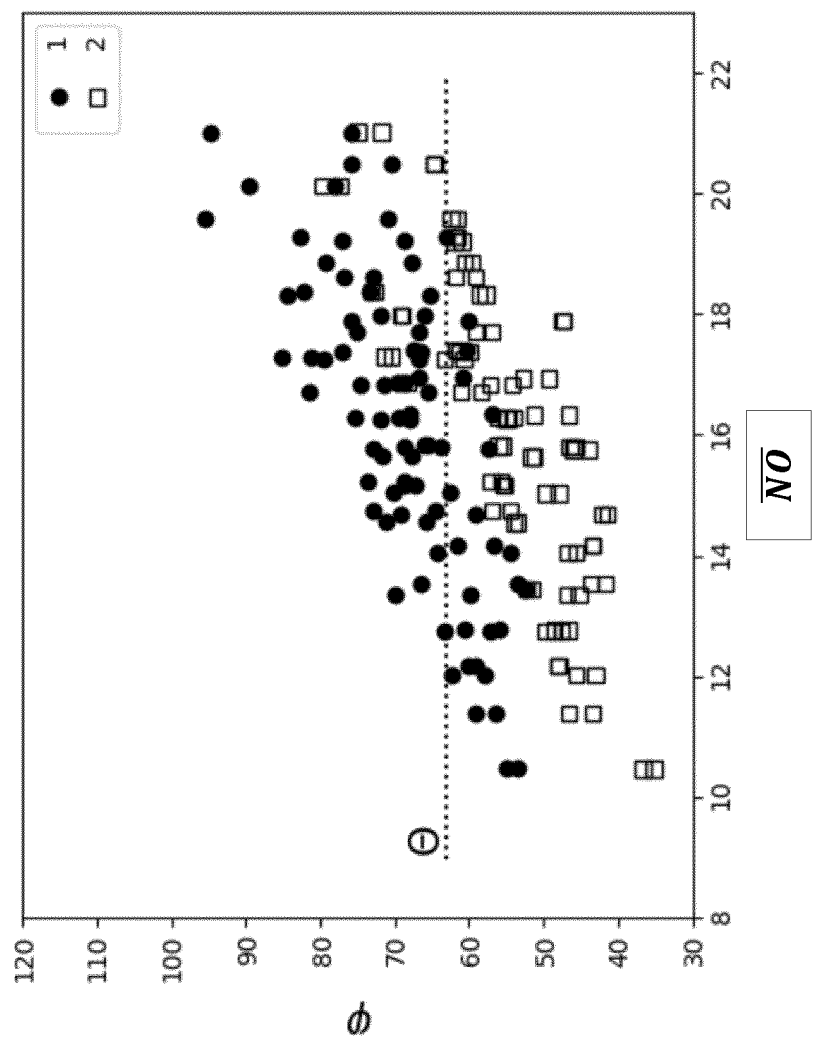

FIG. 13 is a graphical representation of the variation of the optical fluctuation indices $\varphi$ of a laminated glass comprising two glass sheets and an interlayer as a function of the optical quality index $\overline{NO}$ of the combinations of two glass sheets chosen from among a set of 10 glass sheets, for two given shapes 1 and 2 of laminated glass and a given optical power constraint, $\Theta$.

Figure 1:
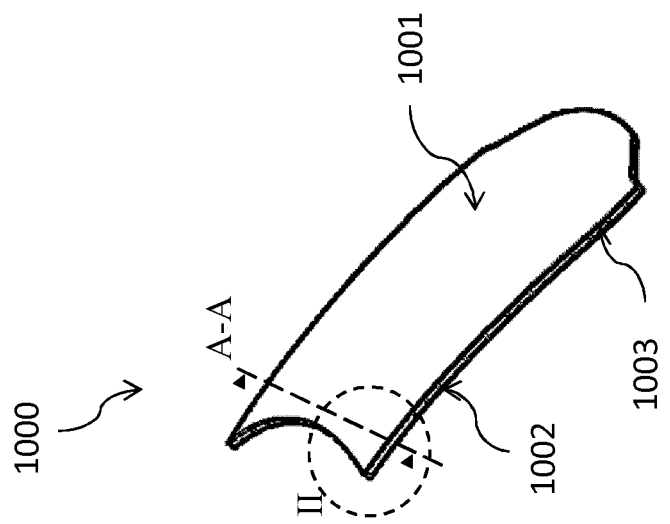
FIG. 1 is a schematic representation of an exemplary laminated glass with a given shape.

FIG. 1 represents schematically, in an XYZ orthonormal frame, an exemplary laminated glass 1000 with a first main face 1001, a second main face 1002 and an edge 1003.

Figure 2:
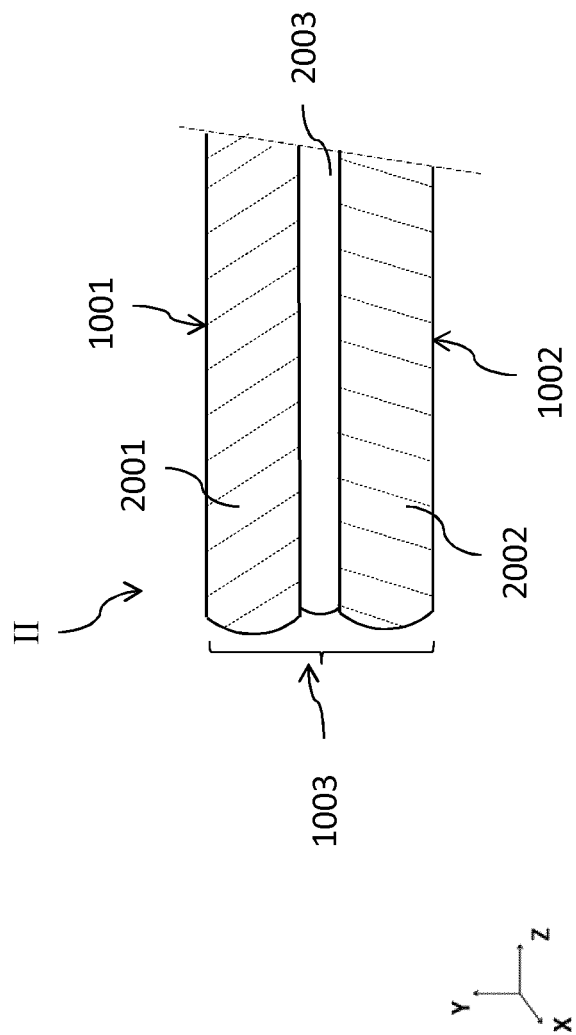
FIG. 2 is a schematic representation of the cross-section along the plane A-A of the detail II of the laminated glass of FIG. 1.

FIG. 2 is a diagram of the cross-section along the plane A-A of the detail II of the laminated glass of FIG. 1. By way of example, the laminated glass is formed of a first glass sheet 2001, a second glass sheet 2002 and a lamination interlayer 2003. The first main face 1001, a second main face 1002 and the edge 1003 are also indicated on the diagram.

Figure 3:
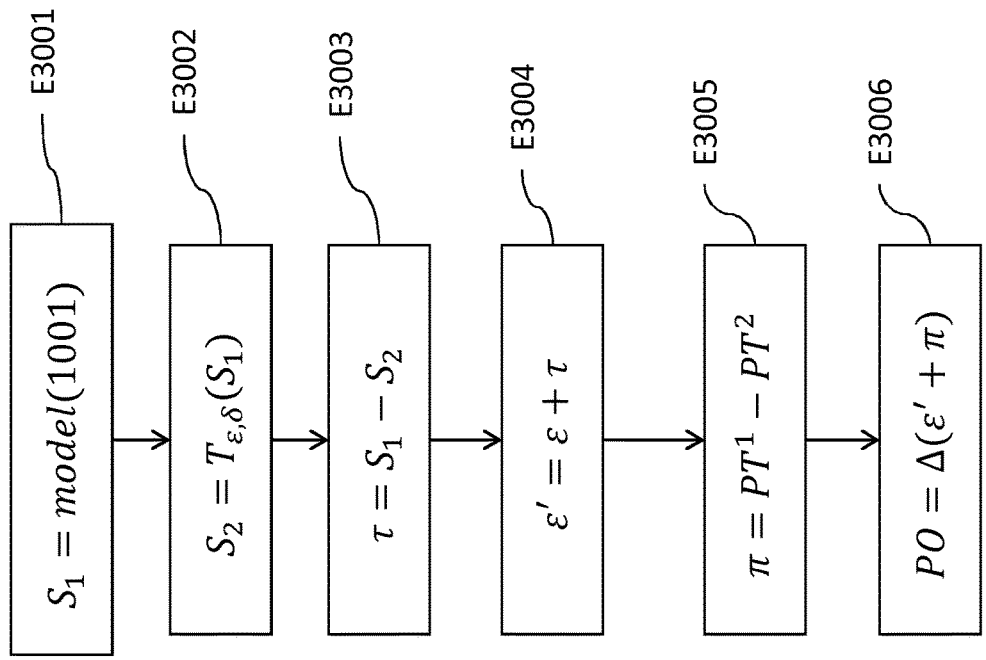
FIG. 3 is a representation in logic chart form of the simulation method of the invention.

The simulation method of the invention is represented in logic chart form in FIG. 3. It comprises the following steps:
  a. the geometric modeling E3001 of a first surface liable to correspond to the first main face 1001 of the laminated glass on the basis of a numerical model of the shape of said laminated glass so as to form a first modeled surface $S_1$;
  b. the geometric modeling E3002 of a second surface obtained by translation $T_{\varepsilon,\delta}(S_1)$ of the surface modeled in step (a) along the direction of smallest dimension of the laminated glass by a distance $\varepsilon$ corresponding to the thickness of the glazing, and along the direction of one of the two larger dimensions of the laminated glass by a defined distance $\delta$, the ratio of the distance $\delta$ over the largest dimension of the laminated glass being greater than 0 and less than or equal to 0.01, and said modeling making it possible to obtain a second modeled surface $S_2$;
  c. the calculation E3003 of the geometric offset $\tau$, at each of the points of the modeled surfaces, by subtraction of the first modeled surface $S_1$ and of the second modeled surface $S_2$;
  d. the calculation E3004 of the geometric thickness $\varepsilon'$, at each of the points of the modeled surfaces, by addition of the distance $\varepsilon$ and of the geometric offset $\tau$;
  e. the calculation E3005 of the topological thickness $\pi$, at each of the points of the modeled surfaces, obtained by subtraction of the topographic profiles $PT^1$ and $PT^2$ of the surfaces of glass sheets liable to correspond to the first main face 1001 and to the second main face 1002 of the laminated glass;
  f. the calculation E3006 of the optical power PO, at each of the points of the modeled surfaces, on the basis of the value of the Laplacian of the sum of the geometric thickness $\varepsilon'$ and topological thickness $\pi$.

Figure 4:
FIG. 4 is a representation in logic chart form of an embodiment of the method for determining an interval of optical quality indices required for a combination of glass sheets liable to form a laminated glass.

FIG. 4 is a representation in logic chart form of an embodiment of the determination method, implemented by computer, for determining an interval of optical quality indices required for a combination of glass sheets liable to form a laminated glass of given shape liable to be obtained by laminating at least two glass sheets and at least one lamination interlayer, said laminated glass having a given optical quality constraint, $\Theta$. The laminated glass 1000 comprises a first main face 1001, a second main face 1002 and an edge 1003. For a given shape of laminated glass, the method, implemented by computer, comprises the following steps:
  a. the geometric modeling E4000 of a first surface liable to correspond to the first main face 1001 of the laminated glass on the basis of a numerical model of the shape of said laminated glass so as to form a first modeled surface $S_1$;
  b. the geometric modeling E4001 of a second surface obtained by translation $T_{\varepsilon,\delta}(S_1)$ of the surface modeled in step (a) along the direction of smallest dimension of the laminated glass by a distance $\varepsilon$ corresponding to the thickness of the glazing, and along the direction of one of the two larger dimensions of the laminated glass by a defined distance $\delta$, the ratio of the distance $\delta$ over the largest dimension of the laminated glass being greater than 0 and less than or equal to 0.01, and said modeling making it possible to obtain a second modeled surface $S_2$;
  c. the calculation E4002 of the geometric offset $\tau$, at each of the points of the modeled surfaces, by subtraction of the first modeled surface $S_1$ and of the second modeled surface $S_2$;
  d. the calculation E4003 of the geometric thickness $\varepsilon'$, at each of the points of the modeled surfaces, by addition of the distance $\varepsilon$ and of the geometric offset
  e. the generation E4004 of a set $\mathcal{P}_k(E)$ of k glass sheets chosen from among a set E of glass sheets with which are associated at least one identifier, a topographic profile and an optical quality index;
  f. the initialization 14005 of an iterative variable l;
  g. the selection E4006 of a combination $c_l$ in the set $\mathcal{P}_k(E)$;
  h. the calculation E4007 of the topological thickness $\pi$, at each of the points of the modeled surfaces, obtained by subtraction of the topographic profiles $PT^1$ and $PT^2$ of the surfaces of glass sheets liable to correspond to the first main face 1001 and to the second main face 1002 of the laminated glass liable to comprise the combination $c_l$;

i. the calculation E4008 of the optical power PO, at each of the points of the modeled surfaces, on the basis of the value of the Laplacian of the sum of the geometric thickness ε' and topological thickness π;

j. the calculation E4008 of the optical fluctuation index φ corresponding to the maximum value of the set of differences between the maximum and minimum values of the optical powers PO in a sliding sampling window;

k. the calculation E4009 of the optical quality index $\overline{NO}(c_l)$ of the combination $c_l$ of glass sheets on the basis of the optical quality indices of the two glass sheets of the combination, one of the surfaces of each of said two glass sheets is liable to correspond respectively to the first main face or to the second main face of the laminated glass;

l. the incrementation I40010 of the iterative variable l by one unit; the repetition of steps (g) to (j) with, at each iteration, a new combination $c_l$ of glass sheets; the iterative variable l being incremented by one unit until it becomes equal to the value of the binomial coefficient $C_{Card(E)}^k$ with Card(E) the cardinality of the set E of glass sheets;

m. the construction E4011 of a set Φ of values of optical fluctuation indices φ for each combination $c_l$ in the set $\mathcal{P}_k(E)$;

n. the selection E4012 of the interval I of the optical quality indices $\overline{NO}(c_l)$ of the combinations $c_l$ of glass sheets satisfying the result of the comparison of step (l).

Figure 5:
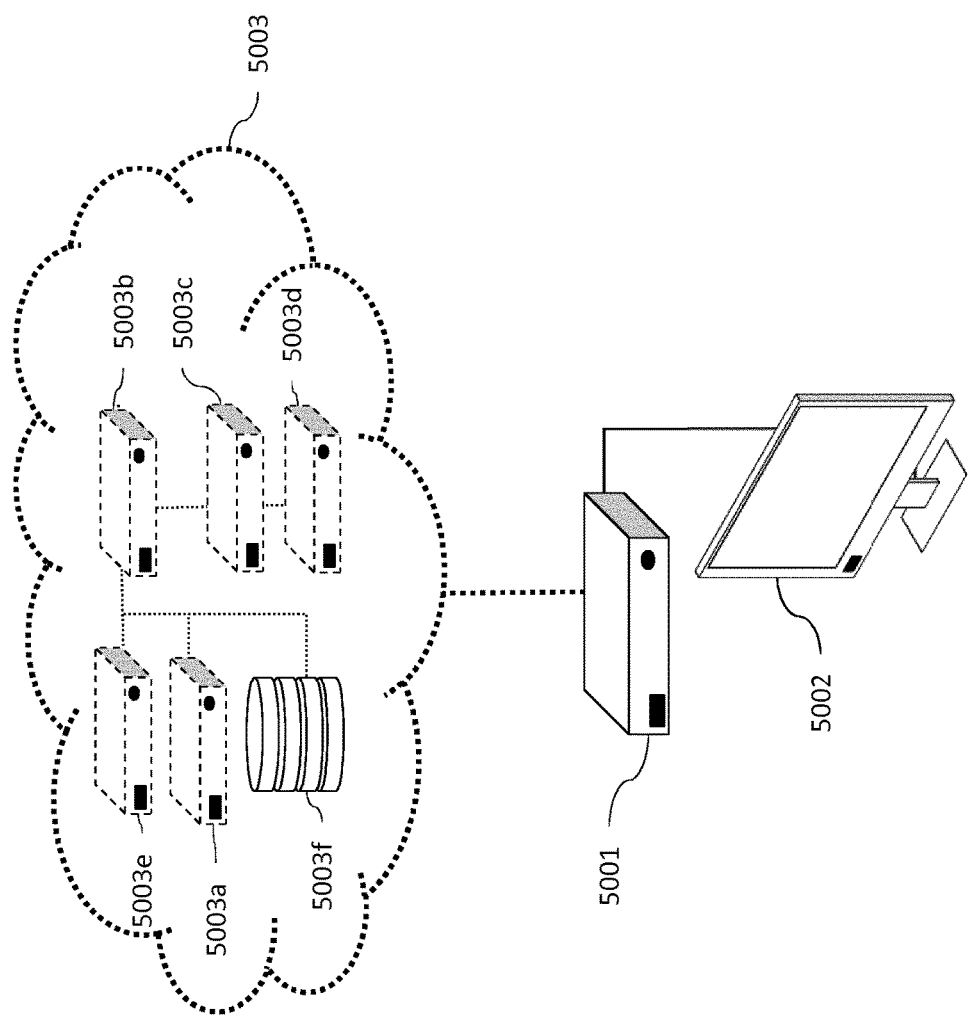
FIG. 5 is a schematic representation of an embodiment of a data processing system comprising means for implementing the steps of a simulation method of the invention.

FIG. 5 is a schematic representation of an embodiment of a data processing system comprising means for implementing the steps of an embodiment of the method for determining an interval of optical quality indices required for a combination of glass sheets liable to form a laminated glass of given shape liable to be obtained by laminating at least two glass sheets and at least one lamination interlayer, said laminated glass having a given optical quality constraint, Θ. The system comprises a computer 5001 in telecommunication with a computing infrastructure 5003 of "cloud computing" type. The means are integrated into the computing infrastructure 5003. Said computing infrastructure 5003 comprises the following means:

a. a selection means 5003a for selecting a combination of glass sheets from among a set of glass sheets with which are associated at least one identifier, a topographic profile and an optical quality index;

b. a calculation means E5003b for calculating the optical quality index of the combination of glass sheets on the basis of the optical quality indices of the two glass sheets of the combination, one of the surfaces of each of said two glass sheets is liable to correspond respectively to the first main face or to the second main face of the laminated glass;

c. a system for processing data 5003c determination of an optical fluctuation index φ of a laminated glass liable to comprise the combination of the glass sheets;

d. a comparison means 5003d for comparing the values of the optical fluctuation indices φ with the value of the optical quality constraint Θ;

e. a selection means 5003e for selecting the interval of the optical quality indices of the combinations of the glass sheets satisfying the result of the comparison.

The computing infrastructure furthermore comprises a database 5003f containing for each glass sheet of a laminated glass set, an identifier, a topographic profile and an optical quality index. The computer comprises an input-output graphical interface 5002 allowing human-machine interactions.

Figure 6:
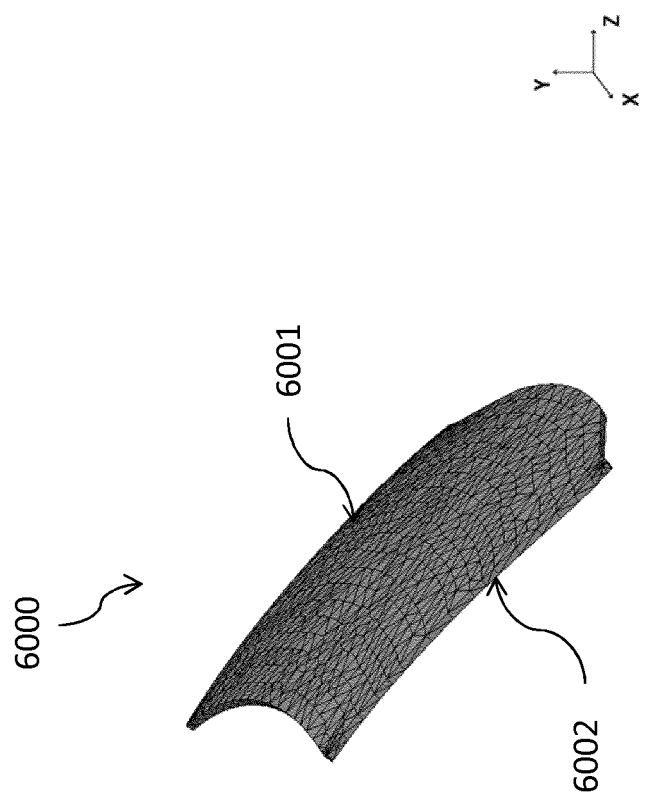
FIG. 6 is a geometric modeling of the shape of the laminated glass of FIG. 1.

An exemplary modeling 6000 of the shape of the laminated glass of FIG. 1 is represented in FIG. 6. The modeling has been obtained by meshing the surface. A first modeled surface 6001 is obtained by geometric modeling of the first main face 1001 of the laminated glass.

Figure 7:
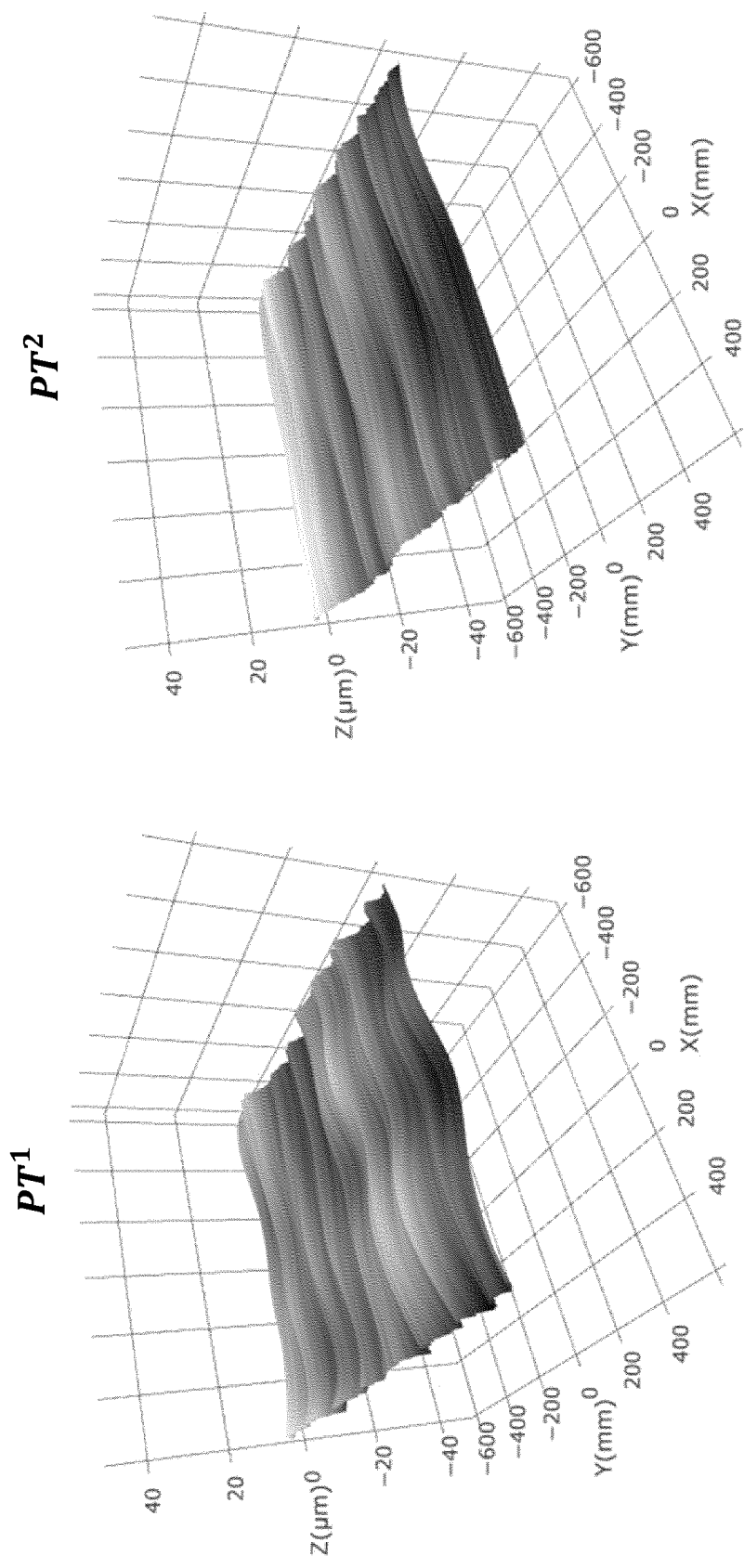
FIG. 7 is a three-dimensional graphical representation of the examples of topographic profiles of the surfaces of glass sheets liable to correspond to the first main face and to the second main face of a laminated glass.

FIG. 7 is a three-dimensional graphical representation of examples of topographic profiles $PT^1$ and $PT^2$ of the surfaces of the glass sheets liable to correspond respectively to the first main face 1001 and to the second main face 1002 of a laminated glass. More particularly, it represents the variation in μm of the relief of the surfaces of the glass sheets. In the figure, the Z axis is the scale of the variation of the relief and the X and Y axes are in the plane of the glass sheets. For conciseness reasons, only the reliefs of a region of the surfaces are represented.

Figure 8:
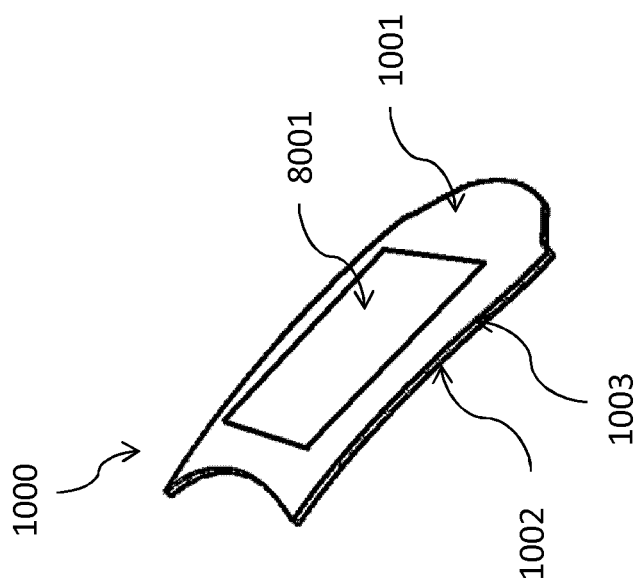
FIG. 8 is a schematic representation of a delimitation of a region of the laminated glass in which a fluctuation index $\varphi$ is liable to be calculated.

FIG. 8 is a schematic representation of a delimitation of a region 8001 of the laminated glass 1000 in which a fluctuation index φ is liable to be calculated. In particular, this region is delimited by the intersection of the main faces of said laminated glass 1000 with a square-based pyramid (not represented) whose apex is situated in the direction of the Z axis at a defined distance from the main faces 1001 and 1002, the two angles at the vertex between the opposing lateral faces of said pyramid lying respectively between 10° and 20°, and between 5 and 15°. The shape of the region is generally rectangular or square.

Figure 9:
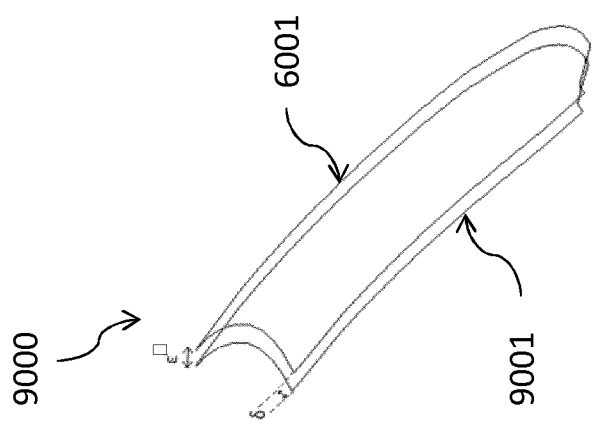
FIG. 9 is a simplified representation of the first and second modeled surfaces of the laminated glass with the translation by a distance $\delta$ and the geometric thickness $\varepsilon$.

FIG. 9 is a simplified representation of the second modeled surface 9001 of the laminated glass, obtained by translation of the first modeled surface 6001 along the direction of smallest dimension of the laminated glass by a distance ε corresponding to the thickness of the glazing, and along the direction of one of the two larger dimensions of the laminated glass by a defined distance δ, the ratio of the distance δ over the largest dimension of the laminated glass being greater than 0 and less than or equal to 0.01. In the XYZ orthonormal frame of the figure, the translation by a distance δ is carried out along the direction of the X or Y axes or along a direction which is a linear combination of the X and Y axes. The translation by the distance ε is carried out along the direction of the Z axis.

Figure 10:
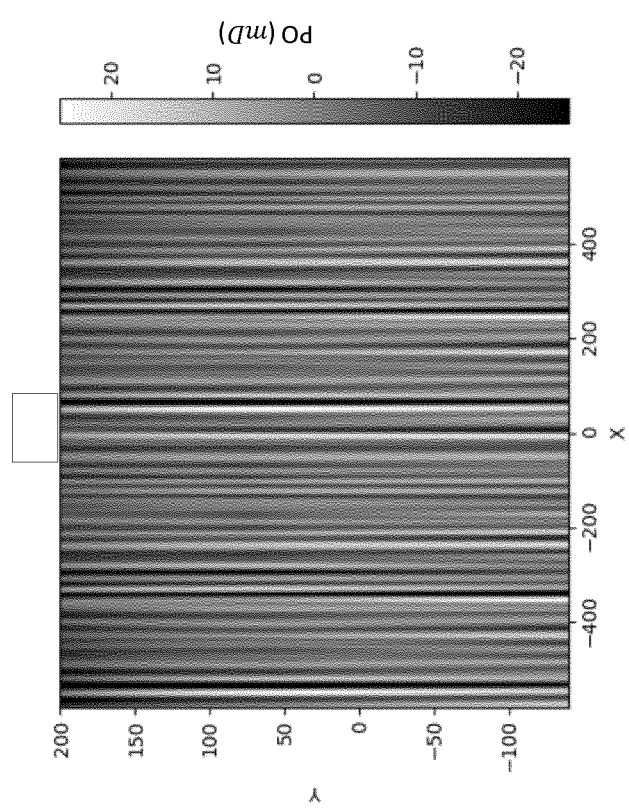
FIG. 10 is a graphical representation of the optical power of the laminated glass of FIG. 1 obtained with the aid of the method of ray tracing.

FIG. 10 is a graphical representation of the optical power of a region of the laminated glass of FIG. 1 obtained with the aid the method of ray tracing. The grayscale represents the optical power expressed in millidiopters (mD). The region of the laminated glass in which the optical power has been calculated is a region of the type of that of FIG. 8. The X and Y axes of the figure correspond to the axes of FIG. 1. The unit of the axes and the position of the center of the frame are arbitrary. The method of ray tracing is a method known from the prior art, frequently used in the technical field.

Figure 11:
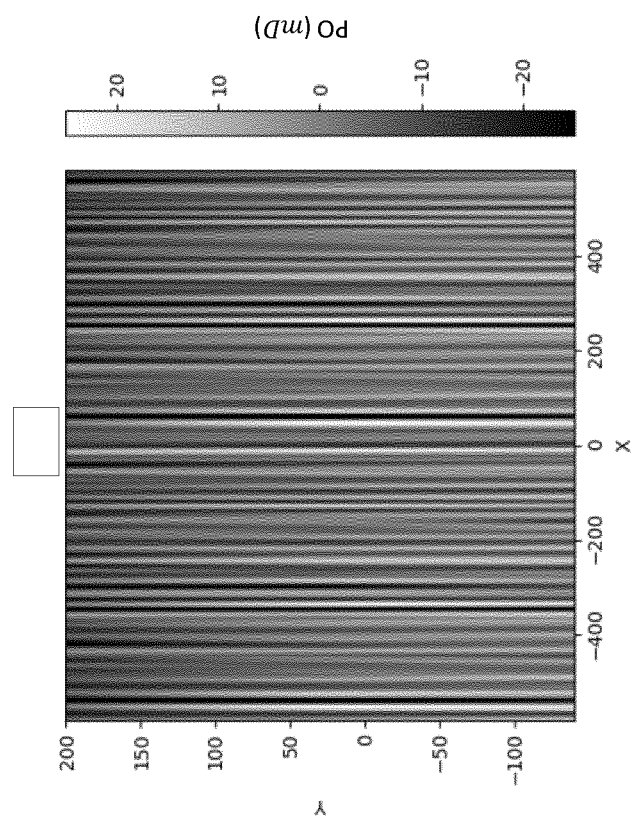
FIG. 11 is a graphical representation of the optical power of the laminated glass of FIG. 1 obtained with the aid of the simulation method of the invention with a value $\delta$=0.04.

FIG. 11 is a graphical representation of the optical power of a region of the laminated glass of FIG. 1 obtained with the aid of the simulation method of the invention with a value δ=0.04. For the simulation, the topographic profiles of the glass sheets of the type of those of FIG. 7 have been used. The grayscale represents the optical power expressed in millidiopters (mD). The region of the laminated glass in which the optical power has been calculated is a region of the type of that of FIG. 8. The X and Y axes of the figure correspond to the axes of FIG. 1. The unit of the axes and the position of the center of the frame are arbitrary.

Figure 12:
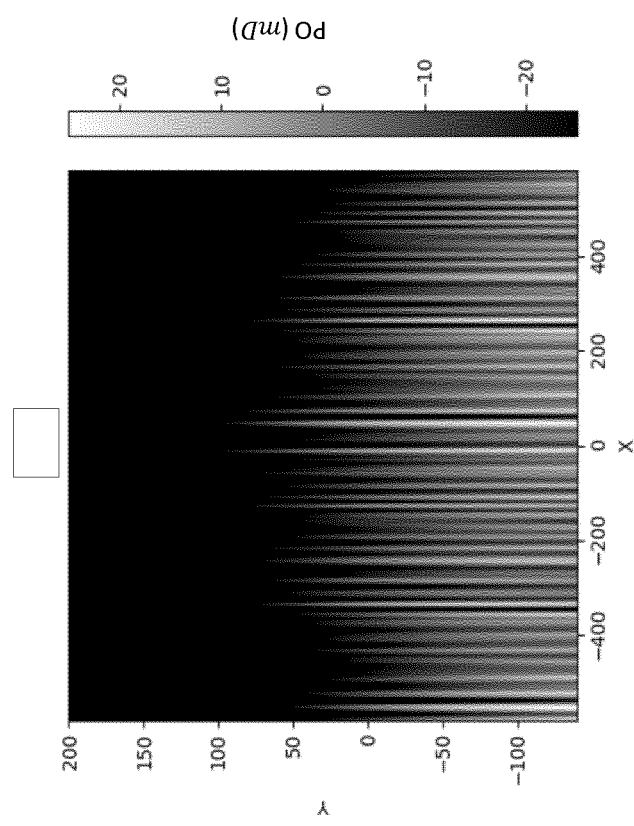
FIG. 12 is a graphical representation of the optical power of the laminated glass of FIG. 1 obtained with the aid of the simulation method of the invention with a value $\delta$=0.004.

FIG. 12 is a graphical representation of the optical power of a region of the laminated glass of FIG. 1 obtained with the aid of the simulation method of the invention with a value δ=0.004. For the simulation, the topographic profiles of the glass sheets of the type of those of FIG. 7 have been used. The grayscale represents the optical power expressed in millidiopters (mD). The region of the laminated glass in which the optical power has been calculated is a region of the type of that of FIG. 8. The X and Y axes of the figure correspond to the axes of FIG. 1. The unit of the axes and the position of the center of the frame are arbitrary.

FIG. 13 is a graphical representation of the variation of the optical fluctuation indices φ of a laminated glass liable to comprise two glass sheets and an interlayer as a function of the optical quality index $\overline{NO}$ of the combinations of two glass sheets chosen from among a set of glass sheets. The optical fluctuation indices φ have been calculated for two given shapes 1 and 2 of the laminated glass and a given optical quality constraint Θ. The number of combinations for each of the two shapes is 45. This graphical representation has been obtained with the aid of the method of the invention making it possible to determine the interval of optical quality indices required for a combination of glass sheets liable to form a laminated glass comprising at least two glass sheets and at least one interlayer, said laminated glass having a given optical power constraint, Θ. The optical quality index $\overline{NO}$ of the combinations of the two glass sheets is the root mean square of the mean optical quality indices of the two glass sheets of the combination. Said mean optical quality indices have been obtained by ombroscopic methods. In the figure the optical quality constraint, Θ, is represented by the dotted line. The plots in the form of solid circles represent the results obtained for shape 1 of the laminated glass; those in the form of empty squares represent the results obtained for shape 2 of the laminated glass.

EXAMPLE 1

The first example compares the values of optical power of a laminated glass with the aid of the simulation method of the invention and with the aid of the method of ray tracing, which is known from the prior art and used frequently in the technical field.

The laminated glass comprises two sheets of soda-lime glass and a lamination interlayer. Its shape and its structure are represented schematically in FIGS. 1 and 2 respectively. The laminated glass 1000 comprises a first glass sheet 2001, a second glass sheet 2002 and a lamination interlayer 2003 so as to form a first main face 1001, a second main face 1002 and an edge 1003.

The thickness of the glass sheets is 2.1 mm. The refractive index of the glass is 1.51.

Extracts of the topographic profiles $PT^1$ and $PT^2$ of the surfaces of the glass sheets corresponding to the first main face 1001 and to the second main face 1002 of the laminated glass respectively are represented in FIG. 7. The topographic profiles have been acquired by ombroscopy.

The two methods have been implemented with the aid of a data processing system comprising a computer of standard performance.

FIG. 10 is a graphical representation of the optical power of a region of the laminated glass, obtained with the aid of the method of ray tracing. FIG. 11 is the graphical representation of the optical power of a region of the laminated glass, obtained with the aid of the simulation method of the invention with a value δ=0.04. FIG. 12 represents the optical power obtained with a value δ=0.004. The grayscale represents the optical power expressed in millidiopters (mD). In the three figures, the unit of the X and Y axes, and the position of the center of the frame are arbitrary.

The comparison of FIGS. 10 and 11 shows that the results obtained with the aid of the simulation method of the invention with a value δ greater than 0.01 are different from those obtained with the method of ray tracing. It has, furthermore, been found experimentally that when the value of δ is greater than 0.01 the results are incorrect.

Comparison of FIGS. 10 and 12 shows that the results obtained with the aid of the simulation method of the invention with a value δ of less than 0.01 are identical, or else very close, to those obtained with the method of ray tracing. On the other hand, the simulation method of the invention is, in terms of execution speed, about 50 times faster to implement than the method of ray tracing. This swiftness of implementation enables the real-time use of the method on laminated-glass production lines where changes in production planning are liable to take place.

EXAMPLE 2

The second example illustrates the advantages of the simulation method of the invention when it is used in a method of an interval of optical quality indices required for a combination of glass sheets liable to form a laminated glass of given shape liable to be obtained by laminating at least two glass sheets and at least one lamination interlayer, said laminated glass having a given optical quality constraint, Θ.

The interval of optical quality indices required for a combination of two glass sheets liable to form a laminated glass comprising two glass sheets (Glass 1 and Glass 2) and a lamination interlayer has been determined for two shapes 1 and 2 of laminated glass. The combination of two glass sheets is chosen from among a set of 10 glasses.

The optical quality index $\overline{NO}$ of the combinations of two glass sheets is the root mean square of the mean optical quality indices of the two glass sheets of the combination. Said mean optical quality indices of the glass sheets have been obtained by ombroscopic methods.

The table hereinbelow groups together the 45 combinations evaluated. In the first row (Glass 1) and the first column (Glass 2) of the table are indicated in bold the values of the optical quality indices of each of the ten glasses. Each intersection of the rows and columns represents a combination of two glasses Glass 1 and Glass 2. The value at each intersection is the value of the quality index $\overline{NO}$ of the combination, root mean square of the optical quality indices of Glass 1 and of Glass 2.

| Glass 1 | 9.54 | 11.32 | 12.97 | 14.06 | 15.29 | 16.31 | 18.23 | 19 | 20.14 | 21.86 |
|---|---|---|---|---|---|---|---|---|---|---|
| Glass 2 | | | | | | | | | | |
| 9.54 | — | | | | | | | | | |
| 11.32 | 10.47 | — | | | | | | | | |
| 12.97 | 11.38 | 12.17 | — | | | | | | | |
| 14.06 | 12.01 | 12.76 | 13.53 | — | | | | | | |
| 15.29 | 12.74 | 13.45 | 14.18 | 14.69 | — | | | | | |

-continued

| Glass 1 | 9.54 | 11.32 | 12.97 | 14.06 | 15.29 | 16.31 | 18.23 | 19 | 20.14 | 21.86 |
|---|---|---|---|---|---|---|---|---|---|---|
| 16.31 | 13.36 | 14.04 | 14.73 | 15.23 | 15.81 | — | | | | |
| 18.23 | 14.55 | 15.17 | 15.82 | 16.28 | 16.82 | 17.30 | — | | | |
| 19 | 15.03 | 15.64 | 16.27 | 16.71 | 17.25 | 17.71 | 18.62 | — | | |
| 20.14 | 15.76 | 16.34 | 16.94 | 17.37 | 17.88 | 18.33 | 19.21 | 19.58 | — | |
| 21.86 | 16.87 | 17.41 | 17.97 | 18.38 | 18.86 | 19.29 | 20.13 | 20.48 | 21.02 | — |

For each combination and each of the two shapes of the laminated glass, an optical fluctuation index φ has been calculated. In the example, the optical fluctuation index φ is defined as the maximum value of a set of values corresponding to the differences between the maximum and minimum values of the optical powers in a square sliding sampling window. The lateral dimension of the sampling window is 80 mm. The calculation of the optical fluctuation indices has been carried out in a region of the laminated glass. This region is the region delimited by the intersection of the main faces of said laminated glass with a square-based pyramid whose apex is situated at a defined distance from the main faces and the two angles at the vertex between the opposing lateral faces of said pyramid lie respectively between 10° and 20°, and between 5 and 15°. The lateral dimensions of this region on the laminated glass are 200 mm×1000 mm. The unit of φ is the millidiopter (mD).

The results are represented in FIG. 13. The optical power constraint, Θ, is represented by the dotted line. It is defined at 63. The plots in the form of solid circles represent the results obtained for shape 1 of the laminated glass; those in the form of empty squares represent the results obtained for shape 2 of the laminated glass.

For shape 1, the optical quality constraint Θ is satisfied when the value of the optical quality index $\overline{NO}$ of the combination of two glass sheets is less than 13; for shape 2 when it is less than 17.

FIG. 13 shows clearly that said method makes it possible to determine an interval of optical quality indices required for a combination of glass sheets liable to form a laminated glass comprising at least two glass sheets and at least one interlayer.

The invention claimed is:

1. A method for manufacturing a laminated glass having a shape and including at least two glass sheets and at least one lamination interlayer, said laminated glass to have an edge, a first main face, and a second main face, the method comprising:
    determining an optical quality of the at least two glass sheets by performing a simulation method, implemented by computer, for simulating the optical power of the laminated glass to be obtained, said simulation method comprising the following steps:
    (a1) geometric modeling of a first surface to correspond to the first main face of the laminated glass on a basis of a numerical model of the shape of said laminated glass so as to form a first modeled surface, the first modeled surface comprising a plurality of points having first coordinates;
    (b1) geometric modeling of a second surface obtained by translation of the surface modeled in step (a1) along a direction of smallest dimension of the laminated glass by a distance ε corresponding to the thickness of the laminated glass, and along a direction of one of the two larger dimensions of the laminated glass by a defined distance δ, a ratio of the distance δ over the largest dimension of the laminated glass being greater than 0 and less than or equal to 0.01, and said geometric modeling of the second surface providing a second modeled surface, the second modeled surface comprising a plurality of points having second coordinates;
    (c1) calculating a geometric offset τ, at each of the plurality of points of the first and second modeled surfaces, by subtraction of the first modeled surface and of the second modeled surface;
    (d1) calculating a geometric thickness ε', at each of the plurality of points of the first and second modeled surfaces, by addition of the distance ε and of the geometric offset τ;
    (e1) calculating a topological thickness π, at each of the plurality of points of the first and second modeled surfaces, by subtraction of topographic profiles of the surfaces of the at least two glass sheets to correspond to the first main face and second main face of the laminated glass;
    (f1) calculating an optical power PO, at each of the plurality of points of the first and second modeled surfaces, on a basis of the value of the Laplacian of the sum of the geometric thickness ε' and topological thickness π, and
    based on a result of the determined optical quality of the at least two glass sheets, manufacturing the laminated glass by laminating the at least two glass sheets and the at least one lamination interlayer.

2. The method as claimed in claim 1, wherein the geometric thickness ε' and topological thickness π are each weighted by an optical amplification factor dependent on an angle, θ, formed between a direction normal to the first modeled surface and a reference direction of observation of the laminated glass.

3. The method as claimed in claim 1, wherein the topographic profiles of the surfaces of glass sheets to correspond to the first main face and to the second main face of the laminated glass are profiles measured by profilometric methods with or without contact.

4. The method as claimed in claim 1, wherein the topographic profiles of the surfaces of glass sheets to correspond to the first main face and to the second main face of the laminated glass are numerically simulated profiles.

5. The method as claimed in claim 1, further comprising, after step (f1) a step of determining an optical fluctuation index φ on a basis of the values of the optical powers PO obtained at each of the plurality of points of the first and second modeled surfaces.

6. The method as claimed in claim 5, wherein the optical fluctuation index φ is the standard deviation of the values of the optical powers PO or to the maximum value of the optical powers.

7. The method as claimed in claim 5, wherein the optical fluctuation index φ is the maximum value of a set of values corresponding to the differences between the maximum and minimum values of the optical powers PO in a sliding sampling window.

8. The method as claimed in claim 7, wherein the sliding sampling window is a square or rectangular sampling window whose lateral dimensions lie between 2 mm and 100 mm.

9. The method as claimed in claim 8, wherein the lateral dimensions lie between 5 mm and 50 mm.

10. The method as claimed in claim 5, wherein the determination of the optical fluctuation index φ is carried out in a limited region of the modeled surfaces.

11. The method as claimed in claim 10, wherein the limited region of the laminated glass is the region delimited by the intersection of the first and second main faces of said laminated glass with a square-based pyramid whose apex is situated at a defined distance from the first and second main faces and the two angles at the vertex between the opposing lateral faces of said pyramid lie respectively between 10° and 20°, and between 5 and 15°.

12. A non-transitory storage medium decipherable by a computer comprising a computer program comprising instructions executable by a computer allowing the execution of the steps of a method as claimed in claim 1.

13. A data processing system comprising circuitry for implementing the steps of a method as claimed in claim 1.

14. A method for manufacturing a laminated glass having a shape and including at least two glass sheets and at least one lamination interlayer, said laminated glass to have an edge, a first main face, and a second main face, the method comprising:
determining an optical quality of the at least two glass sheets by performing a determination method, implemented by computer, for determining an interval of optical quality indices required for a combination of the at least two glass sheets to form the laminated glass, said laminated glass having a given optical quality constraint, Θ, and said determination method comprising the following steps:
(a2) selecting a combination of at least two glass sheets from among a set of glass sheets with which are associated at least one identifier, a topographic profile and an optical quality index;
(b2) calculating the optical quality index of the selected combination of the at least two glass sheets on a basis of the optical quality indices of the at least two glass sheets of the selected combination, one of the surfaces of each of said at least two glass sheets of the selected combination to correspond respectively to the first main face or to the second main face of the laminated glass;
(c2) determining an optical fluctuation index φ of the laminated glass to comprise the selected combination of the at least two glass sheets with the aid of a simulation method;
(d2) repeating steps (a2) to (c2) with a new combination of at least two glass sheets so as to obtain a set of values of optical fluctuation indices φ for the various possible combinations;
(e2) comparing the values of the optical fluctuation indices, φ, with the value of the optical quality constraint Θ;
(f2) selecting the interval of the optical quality indices of the combinations of the glass sheets satisfying the result of the comparison of step (e2), and
based on a result of the determined optical quality of the at least two glass sheets, manufacturing the laminated glass by laminating the least two glass sheets and the at least one lamination interlayer,
wherein the simulation method comprises
(a1) geometric modeling of a first surface to correspond to the first main face of the laminated glass on a basis of a numerical model of the shape of said laminated glass so as to form a first modeled surface, the first modeled surface comprising a plurality of points having first coordinates;
(b1) geometric modeling of a second surface obtained by translation of the surface modeled in step (a1) along a direction of smallest dimension of the laminated glass by a distance ε corresponding to the thickness of the laminated glass, and along a direction of one of the two larger dimensions of the laminated glass by a defined distance δ, a ratio of the distance δ over the largest dimension of the laminated glass being greater than 0 and less than or equal to 0.01, and said geometric modeling of the second surface providing a second modeled surface, the second modeled surface comprising a plurality of points having second coordinates;
(c1) calculating a geometric offset τ, at each of the plurality of points of the first and second modeled surfaces, by subtraction of the first modeled surface and of the second modeled surface;
(d1) calculating a geometric thickness ε', at each of the plurality of points of the first and second modeled surfaces, by addition of the distance ε and of the geometric offset τ;
(d1) calculating a topological thickness π, at each of the plurality of points of the first and second modeled surfaces, by subtraction of topographic profiles of the surfaces of the at least two glass sheets to correspond to the first main face and second main face of the laminated glass,
(f1) calculating an optical power PO, at each of the plurality of points of the first and second modeled surfaces, on a basis of the value of the Laplacian of the sum of the geometric thickness ε' and topological thickness π, and
(g1) determining an optical fluctuation index φ on a basis of the values of the optical powers PO obtained at each of the plurality of points of the first and second modeled surfaces.

15. The method as claimed in claim 14, wherein the optical quality index of the combinations of the at least two glass sheets is the root mean square of the mean optical quality indices of the at least two glass sheets of the combination, one of whose surfaces is to correspond respectively to the first main face and to the second main face of the laminated glass, said mean optical quality indices being obtained by ombroscopic methods.

16. A procedure for manufacturing a laminated glass comprising at least two glass sheets and at least interlayer, said laminated glass of given shape having an edge, a first main face and a second main face, said laminated glass having a given optical quality constraint, Θ, said procedure comprises the following steps:
(a) selecting, implemented by computer, a combination of glass sheets from among a set of glass sheets with which are associated at least one identifier, a topographic profile and an optical quality index, said combination of glass sheets to form said laminated glass;
(b) calculating, implemented by computer, the optical quality index of the combination of glass sheets on a basis of the optical quality indices of the two glass sheets of the combination, one of the surfaces of each of said two glass sheets to correspond respectively to the first main face or to the second main face of the laminated glass;

(c) geometric modeling, implemented by computer, of a first surface corresponding to the first main face of the laminated glass on a basis of a numerical model of said laminated glass so as to form a first modeled surface, the first modeled surface comprising a plurality of points having first coordinates;

(d) geometric modeling, implemented by computer, of a second surface obtained by translation of the surface modeled in step (a) to along a direction of smallest dimension of the laminated glass by a distance $\varepsilon$ corresponding to the thickness of the laminated glass, and along the direction of one of the two larger dimensions of the laminated glass by a defined distance $\delta$, the ratio of the distance $\delta$ over the largest dimension of the laminated glass being greater than 0 and less than or equal to 0.01, and said modeling making it possible to obtain a second modeled surface, the second modeled surface comprising a plurality of points having second coordinates;

(e) calculating, implemented by computer, of a geometric offset $\tau$ obtained by subtraction of the first modeled surface and of the second modeled surface at each of the plurality of points of the first and second surfaces;

(f) calculating, implemented by computer, of a geometric thickness $\varepsilon'$ by addition of the distance $\varepsilon$ and of the geometric offset $\tau$ at each of the plurality of points of the modeled first and second surfaces;

(g) calculating, implemented by computer, of a topological thickness $\pi$ obtained by subtraction of the topographic profiles of the first and second surfaces of the glass sheets to correspond to the first main face and second main face of the laminated glass at each of the plurality of points of the first and second main faces;

(h) calculating, implemented by computer, of an optical power PO on a basis of the value of the Laplacian of the sum of the geometric thickness $\varepsilon'$ and topological thickness $\pi$ at each of the plurality of points of the modeled first and second surfaces;

(i) calculating, implemented by computer, of an optical fluctuation index $\varphi$ corresponding to the maximum value of a set of values corresponding to the maximum values of the differences between the maximum and minimum values of the optical powers PO in a sliding sampling window;

(j) repeating steps (a) to (i) with a new combination of glass sheets so as to obtain a set of values of optical fluctuation indices $\varphi$ for each possible combination;

(k) comparing, implemented by computer, the values of the optical fluctuation indices, $\varphi$, with the value of the optical quality constraint $\Theta$;

(l) selecting, implemented by computer, the interval of the optical quality indices of the combinations of the glass sheets satisfying the result of the comparison of step (j);

(m) manufacturing a laminated glass comprising a combination of the glass sheets whose optical quality index lies in the interval determined in step (k).

* * * * *